(12) United States Patent
Kang et al.

(10) Patent No.: US 10,673,482 B2
(45) Date of Patent: Jun. 2, 2020

(54) SIGNAL TRANSMISSION DEVICE AND LINKING METHOD THEREOF

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Wen-Juh Kang, Hsinchu (TW); Yu-Chu Chen, Hsinchu (TW); Hua-Shih Liao, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/294,888

(22) Filed: Mar. 6, 2019

(65) Prior Publication Data
US 2020/0067557 A1    Feb. 27, 2020

(30) Foreign Application Priority Data
Aug. 27, 2018 (TW) ............................. 107129826 A

(51) Int. Cl.
*H04B 1/38* (2015.01)
*H04B 1/40* (2015.01)
*G06G 7/16* (2006.01)
*H03H 17/06* (2006.01)
*H03H 17/02* (2006.01)

(52) U.S. Cl.
CPC ................. *H04B 1/40* (2013.01); *G06G 7/16* (2013.01); *H03H 17/0248* (2013.01); *H03H 17/06* (2013.01)

(58) Field of Classification Search
CPC ...... H04B 1/40; H03H 17/06; H03H 17/0248; G06G 7/16
See application file for complete search history.

(56) References Cited

U.S. PATENT DOCUMENTS

2013/0208817 A1* 8/2013 Elliott ............... H04L 25/03343
375/259

FOREIGN PATENT DOCUMENTS

CN    107241160 A    10/2017

\* cited by examiner

*Primary Examiner* — Dhaval V Patel
(74) *Attorney, Agent, or Firm* — CKC & Partners Co., LLC

(57) ABSTRACT

A signal transmission device includes a transceiver circuitry and a control circuitry. The transceiver circuitry is configured to receive first device data from an external device through a channel. The control circuitry is configured to calculate a least one system parameter of the transceiver circuitry based on the first device data, second device data associated with the transceiver circuitry, and at least one requirement of a predetermined communication protocol, in order to link with the external device.

18 Claims, 5 Drawing Sheets

SIGNAL TRANSMISSION DEVICE AND LINKING METHOD THEREOF

RELATED APPLICATIONS

This application claims priority to Taiwan Application Serial Number 107129826 filed Aug. 27, 2018, which is herein incorporated by reference.

BACKGROUND

Technical Field

The present disclosure relates to a signal transmission device. More particularly, the present disclosure relates to a signal transmission device having a function of calculating a system parameter and a linking method thereof.

Description of Related Art

Electronic products usually link with another electronic device through various types of communication protocols, in order to exchange data with each other. For example, a display card can exchange data with other components (such as a processor) through transmission interfaces (e.g., peripheral component interconnect express, external serial advanced technology attachment) on a motherboard. During the linking process, different electronic devices need first to adjust related parameters of their internal transceiver circuitry to ensure that data can be exchanged correctly. However, with the current technology, in order to be able to apply the related parameters of different manufacturers, it is necessary to establish a plurality of lookup tables corresponding to the related parameters of the different manufacturers in advance. As a result, excessive memory space is consumed to increase the overall cost.

SUMMARY

Some aspects of the present disclosure are to provide a signal transmission device that includes a transceiver circuitry and a control circuitry. The transceiver circuitry is configured to receive first device data from an external device through a channel. The control circuitry is configured to calculate at least one system parameter of the transceiver circuitry based on the first device data, second device data associated with the transceiver circuitry, and at least one requirement of a predetermined communication protocol, in order to link with the external device.

Some aspects of the present disclosure are to provide a linking method that includes the following operations: receiving first device data from an external device through a channel; and calculating at least one system parameter of a transceiver circuitry based on the first device data, second device data associated with the transceiver circuitry, and at least one requirement of a predetermined communication protocol, in order to link with the external device.

As described above, the signal transmission device and the linking method thereof according to the present disclosure can perform simple operations based on the device data of the device to be linked and the requirement of the communication protocol to adjust the setting of its internal circuit, in order to ensure that the signal of the device to be linked can be correctly received. As a result, the cost of memory for disposing multiple lookup tables can be saved, while the control circuitry is applicable to the related settings of various manufacturers.

DESCRIPTION OF THE EMBODIMENTS

All terms used herein have their ordinary meanings. The above terms are defined in the commonly used dictionaries, and any examples of the use of the term discussed herein included in the description of the present specification are merely for illustrative purposes, and are not intended to limit the scope and meaning of the present disclosure. Similarly, the present disclosure is not limited to the various embodiments described in this specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. It will be understood that, as used herein, the phrase "and/or" includes any and all combinations of one or ore of the associated listed items.

In this document, the term "circuitry" may indicate a system formed with one or more circuits. The term "circuit" may indicate an object, which is formed with one or more transistors and/or one or more active/passive elements based on a specific arrangement, for processing signals.

Figure 1A:
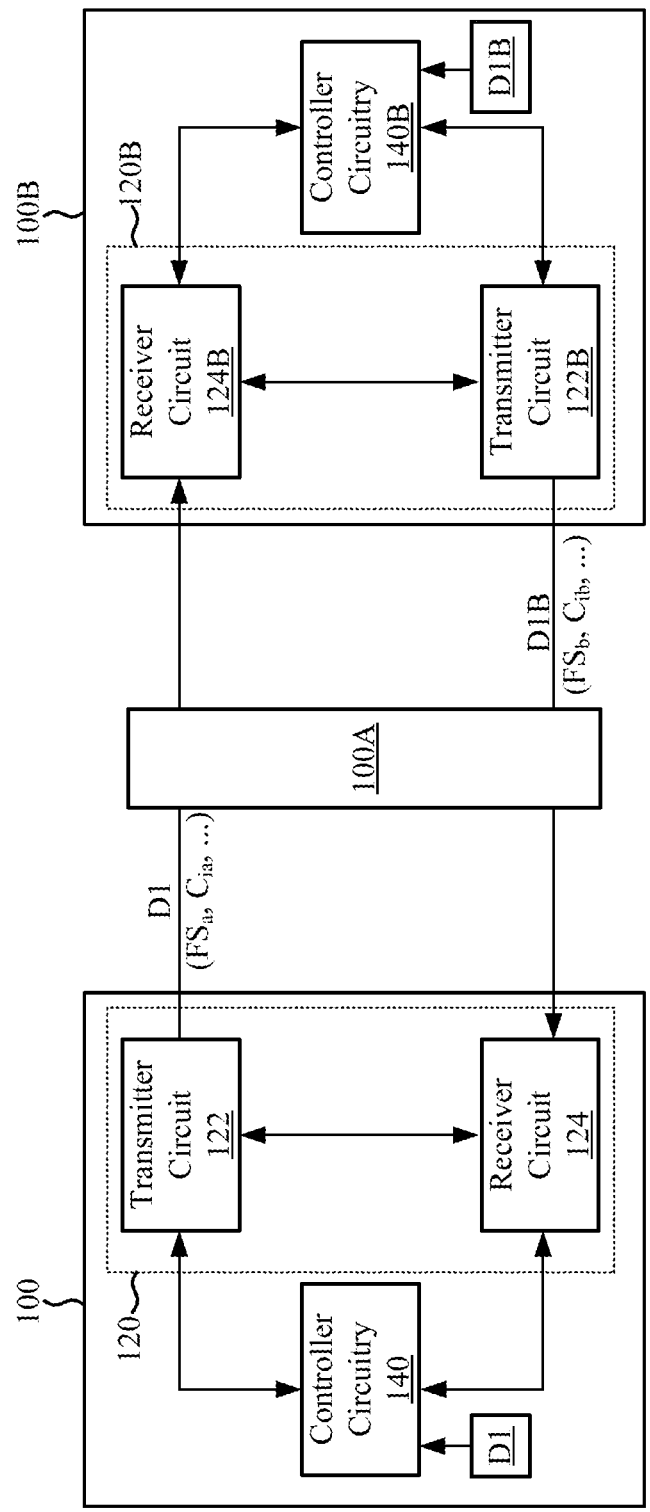
FIG. 1A is a schematic diagram of a signal transmission device according to some embodiments of the present disclosure.

Reference is now made to FIG. 1A. FIG. 1A is a schematic diagram of a signal transmission device 100 according to some embodiments of the present disclosure. In various embodiments, the signal transmission device 100 may be applied to the transmission interfaces in various electronic products (for example, a display card, a network card, a hard drive, etc.).

In some embodiments, the signal transmission device 100 may be coupled to an external device 100B through a channel 100A. The signal transmission device 100 may link with the external device 100B, in order to exchange data with each other. As shown in FIG. 1A, the signal transmission device 100 includes a transceiver circuitry 120 and a control circuitry 140, and the external device 100B includes a transceiver circuitry 120B and a control circuitry 140B.

When establishing a link, the transceiver circuitry 120 receives device data D1B transmitted from the external device 100B. The control circuitry 140 calculates at least one system parameter (such as a tap coefficient $C_{ia}$ described later) of the transceiver circuitry 120 based on device data D1 of the signal transmission device 100, at least one requirement of a predetermined communication protocol, and the device data D1B, in order to link with the external device 100B. In this manner, the transceiver circuitry 120 can be ensured to correctly exchange signals with the external device 100B in subsequent operations.

The device data D1 contains values of one or more system parameters of the transceiver circuitry 120 (such as coefficients $C_{ia}$, $FS_a$, which are described later), and the device data D1B contains values of one or more system parameters of the transceiver circuitry 120B (such as coefficients $C_{ib}$, $FS_b$, which are described later). In some embodiments, the signal transmission device 100 further includes a storage circuit (not shown in the figure) to store the device data D1. In various embodiments, the storage circuit may be implemented by a circuit, such as a register, a memory, or the like, but the present disclosure is not limited thereto. Similarly, the transceiver circuitry 120B may also perform similar operations.

In some embodiments, the device data D1 and the device data D1B are associated with a relevant requirement of the predetermined communication protocol. In some embodiments, the predetermined communication protocol may be various related protocols for transmitting data, such as the peripheral component interconnect express (PCI-E), the external serial advanced technology attachment (SATA), and the like. The types of communication protocols described above are given for illustrative purposes, and various types of communication protocols are within the contemplated scope of the present disclosure.

As shown in FIG. 1A, the transceiver circuitry 120 includes an emitter circuit 122 and a receiver circuit 124. The emitter circuit 122 is configured to transmit a signal (such as the device data D1) to the external device 100B through the channel 100A. The receiver circuit 124 is configured to receive a signal (such as the device data D1B) from the external device 100B through the channel 100A. The control circuitry 140 is configured to adjust at least one system parameter (such as a parameter of a filter, a gain of an amplifier, etc.) of an internal circuit (such as an internal circuit 150 in FIG. 1B) of the emitter circuit 122 and/or the receiver circuit 124 based on the device data D1 and the device data D1B.

Similar to the configuration of the signal transmission device 100, the transceiver circuitry 120B includes an emitter circuit 122B and a receiver circuit 124B. As the configurations and related operations of various circuits of the external device 100B are similar to those of the signal transmission device 100, the repetitious descriptions are not further given herein.

Figure 1B:
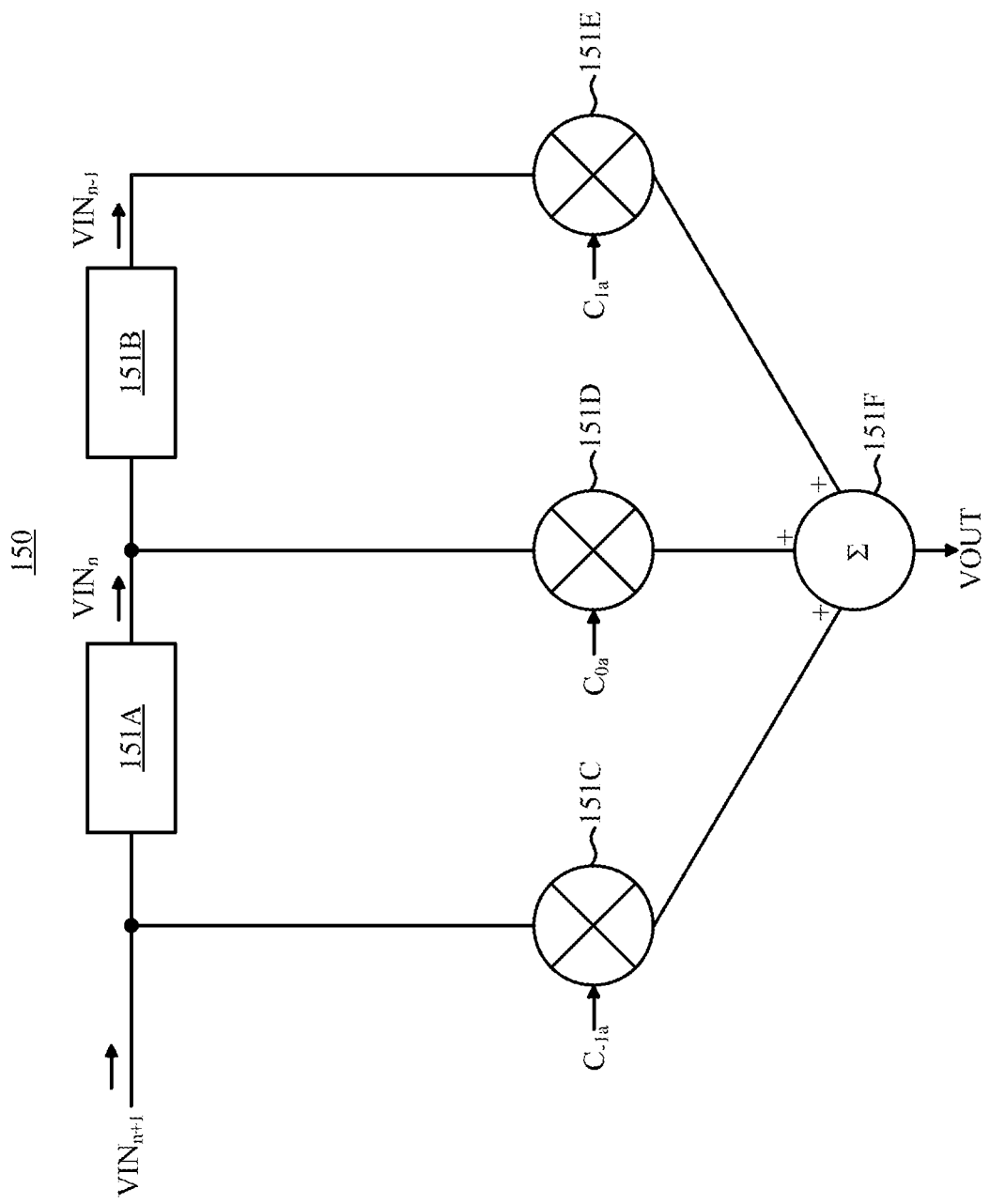
FIG. 1B is a schematic diagram of an internal circuit in an emitter circuitry and/or receiver circuit in FIG. 1A according to some embodiments of the present disclosure.

Reference is now made to FIG. 1B. FIG. 1B is a schematic diagram of the internal circuit 150 in the emitter circuit 122 and/or the receiver circuit 124 in FIG. 1A, according to some embodiments of the present disclosure. For example, to compensate for the high frequency attenuation of the channel 100A, a pre-emphasis circuit or a de-emphasis circuit may be employed in the transceiver circuitry 120. In the linking process, the transceiver circuitry 120 may adjust various parameters of internal circuit(s) thereof based on the device data D1, D1B, and at least one requirement of the predetermined communication protocol, in order to ensure that both parties can exchange signals correctly.

For ease of understanding, in FIG. 1B the PCI-E that is the predetermined communication protocol and the de-emphasis circuit are given for illustrative purposes, but the present disclosure is not limited thereto. In some embodiments, the internal circuit 150 may be disposed in at least one of the emitter circuit 122 and/or the receiver circuit 124. In this example, the internal circuit 150 is operated to serve as the de-emphasis circuit in the emitter circuit 122. In order to compensate for the attenuation of the channel 100A, the internal circuit 150 can be configured to reduce a low frequency component of a signal received by the transceiver circuitry 120 through the channel 100A.

As shown in FIG. 1B, in the example where the predetermined communication protocol is the PCI-E, the internal circuit 150 may be implemented with a finite impulse response (FIR) filter having three taps. A plurality of coefficients $C_{-1a}$, $C_{0a}$, and $C_{1a}$ described later are a plurality of tap coefficients of the FIR filter. The internal circuit 150 includes delay circuits 151A and 151B, multipliers 151C to 151E, and an adder 151F. The delay circuit 151A delays a signal $VIN_{n+1}$ of a next timing by one unit period to generate a signal $VIN_n$, and the delay circuit 151B delays the signal $VIN_n$ by the one unit period to generate a signal $VIN_{n-1}$ of a previous timing. The multiplier 151C multiplies the tap coefficient $C_{-1a}$ and the signal $VIN_{n+1}$, the multiplier 151D multiplies the tap coefficient $C_{0a}$ and the signal $VIN_n$, and the multiplier 151E multiplies the tap coefficient $C_{1a}$ and the signal $VIN_{n-1}$. The adder 151F is coupled to outputs of the multipliers 151C to 151E to add the operation results of the multipliers 151C to 151E, in order to output a data signal VOUT. In some embodiments, the data signal VOUT is the signal actually processed by a baseband circuit in the transceiver circuitry 120B, but the present disclosure is not limited thereto.

Based on the requirement of the current PCI-E, the above tap coefficients $C_{-1a}$, $C_{0a}$, and $C_{1a}$ are satisfied with the following equation (1), where $C_{-1a}$ and $C_{1a}$ are negative numbers, and $FS_a$ is a predetermined coefficient:

$$\sum_{i=-1,0,1} |C_{ia}| = FS_a \qquad (1)$$

Similarly, if the external device 100B expects to link with the signal transmission device 100 through the PCI-E protocol, an internal circuit in the transceiver circuitry 120B also has the same circuit configuration, and its tap coefficient $C_{ib}$ satisfies the following equation (2), where $C_{-1b}$ and $C_{1b}$ are negative numbers, and $FS_b$ is a predetermined coefficient:

$$\sum_{i=-1,0,1} |C_{ib}| = FS_b \qquad (2)$$

Values of the above coefficients $C_{ia}$, $FS_a$, $C_{ib}$, and $FS_b$ are varied with different manufacturers and different applications. In some embodiments, the values of the predetermined coefficients $FS_a$ and $FS_b$ are related to a swing of a signal to be processed. In some embodiments, the values of the tap coefficient $C_{ia}$ and the predetermined coefficient $FS_a$ may be contained in the device data D1. The values of the tap coefficient $C_{ib}$ and the predetermined coefficient $FS_b$ may be contained in the device data D1B.

In order to comply with the requirement of the PCI-E protocol, the related coefficients $C_{ia}$, $FS_a$, $C_{ib}$, and $FS_b$ of the signal transmission device 100 and the external device 100B to be linked further satisfy the following equation (3):

$$\frac{C_{ia}}{FS_a} = \frac{C_{ib}}{FS_b} \quad (3)$$

It can be further derived from the above equation (3) that the tap coefficient $C_{ia}$ satisfies the following equation (4):

$$C_{ia} = \frac{C_{ib}}{FS_b} \times FS_a \quad (4)$$

Hence, the control circuitry 140 can perform the operation of equation (4) to calculate the value of the tap coefficient $C_{ia}$ based on the value of the predetermined coefficient $FS_a$ in the device data D1 and the values of the tap coefficient $C_{ib}$ and the predetermined coefficient $FS_b$ in the device data D1B.

In some approaches, in order to be able to communicate with transceiver circuitries from various manufacturers, lookup tables corresponding to related system parameters set by different manufacturers need to be established in the signal transmission device in advance. Therefore, the signal transmission device can check the values of the related coefficients from the corresponding lookup table according to the data of the device to be linked when establishing the link, in order to adjust the circuitry setting of the transceiver circuitry. However, in these approaches, a considerably large memory space are required to store the settings of various manufacturers, which in turn causes unnecessary waste of circuitry cost and operating power.

Compared with the above approaches, the control circuitry 140 can perform simple operations, such as shift, addition (and/or subtraction), etc., based on the device data D1, the device data D1B of the device to be linked (i.e., the external device 100B), and the requirement of the predetermined communication protocol in a condition that only the circuitry parameters of the signal transmission device 100 itself (i.e., the device data D1) are stored, in order to obtain the related system parameters of the transceiver circuitry 120 through equation (4). As a result, the required memory space can be effectively reduced, the circuitry cost can be obviously reduced, and the control circuitry 140 can be compatible with the transceiver circuitries from different manufacturers.

Figure 2A:
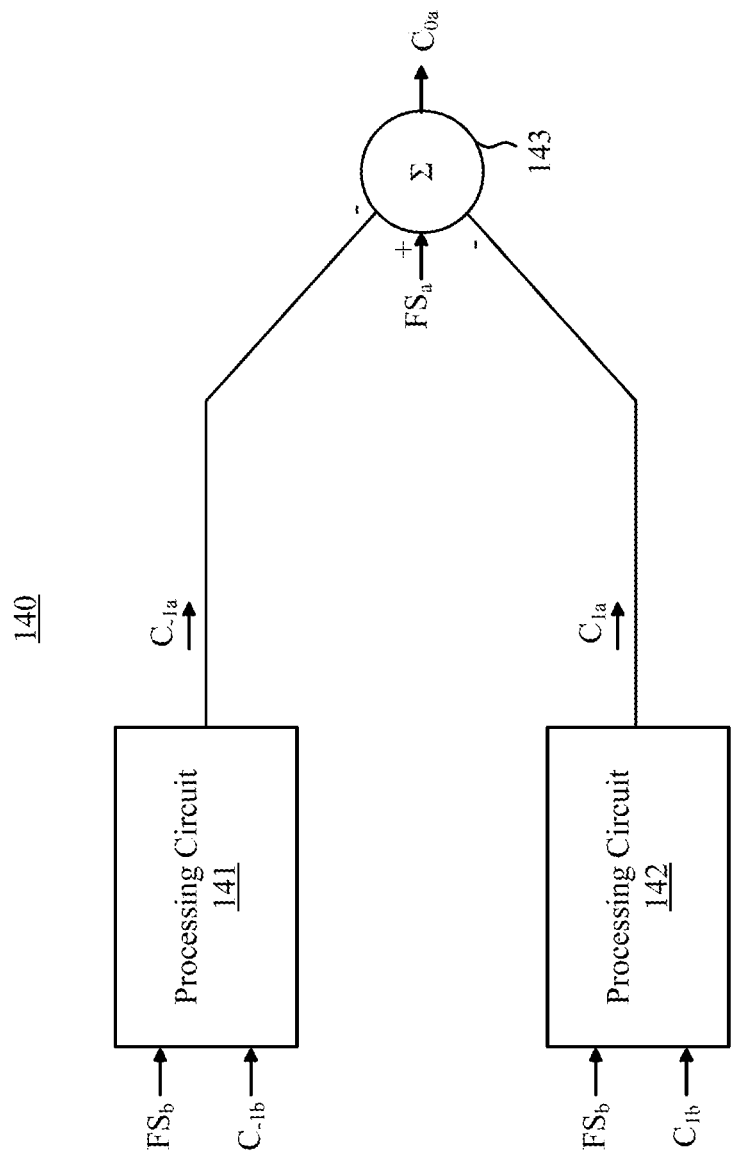
FIG. 2A is a schematic diagram of the control circuitry in FIG. 1A according to some embodiments of the present disclosure.

Reference is now made to FIG. 2A. FIG. 2A is a schematic diagram of the control circuitry 140 in FIG. 1A according to some embodiments of the present disclosure. For ease of understanding, like elements in FIG. 2A are designated with the same reference numbers with respect to FIG. 1A and FIG. 1B.

As shown in FIG. 2A, the control circuitry 140 comprises a plurality of processing circuits 141 to 143. The processing circuit 141 is configured to determine the tap coefficient $C_{-1a}$ based on the tap coefficient $C_{-1b}$ and the predetermined coefficient $FS_b$. The processing circuit 142 is configured to determine the tap coefficient $C_{1a}$ based on the tap coefficient $C_{1b}$ and the predetermined coefficient $FS_b$. The processing circuit 143 is configured to determine the tap coefficient $C_{0a}$ based on the tap coefficients $C_{-1a}$ and $C_{1a}$. For example, the processing circuits 141 and 142 can determine the tap coefficients $C_{-1}$, and $C_{1a}$ according to the above equation (4). After determining the tap coefficients $C_{-1a}$ and $C_{1a}$, the processing circuit 143 can perform the operation of the following equation (5) to determine the tap coefficients $C_{0a}$:

$$C_{0a} = FS_a - |C_{-1a}| - |C_{1a}| \quad (5)$$

In some embodiments, the processing circuit 141 and the processing circuit 142 have a same circuit configuration, and the related description will be provided with reference to the embodiment shown in FIG. 2B that is described later. As shown in FIG. 2A, the processing circuit 143 may be implemented by an operational circuit (for example: an adder or a subtractor) to perform the operation of the above equation (5) in some embodiments.

Figure 2B:
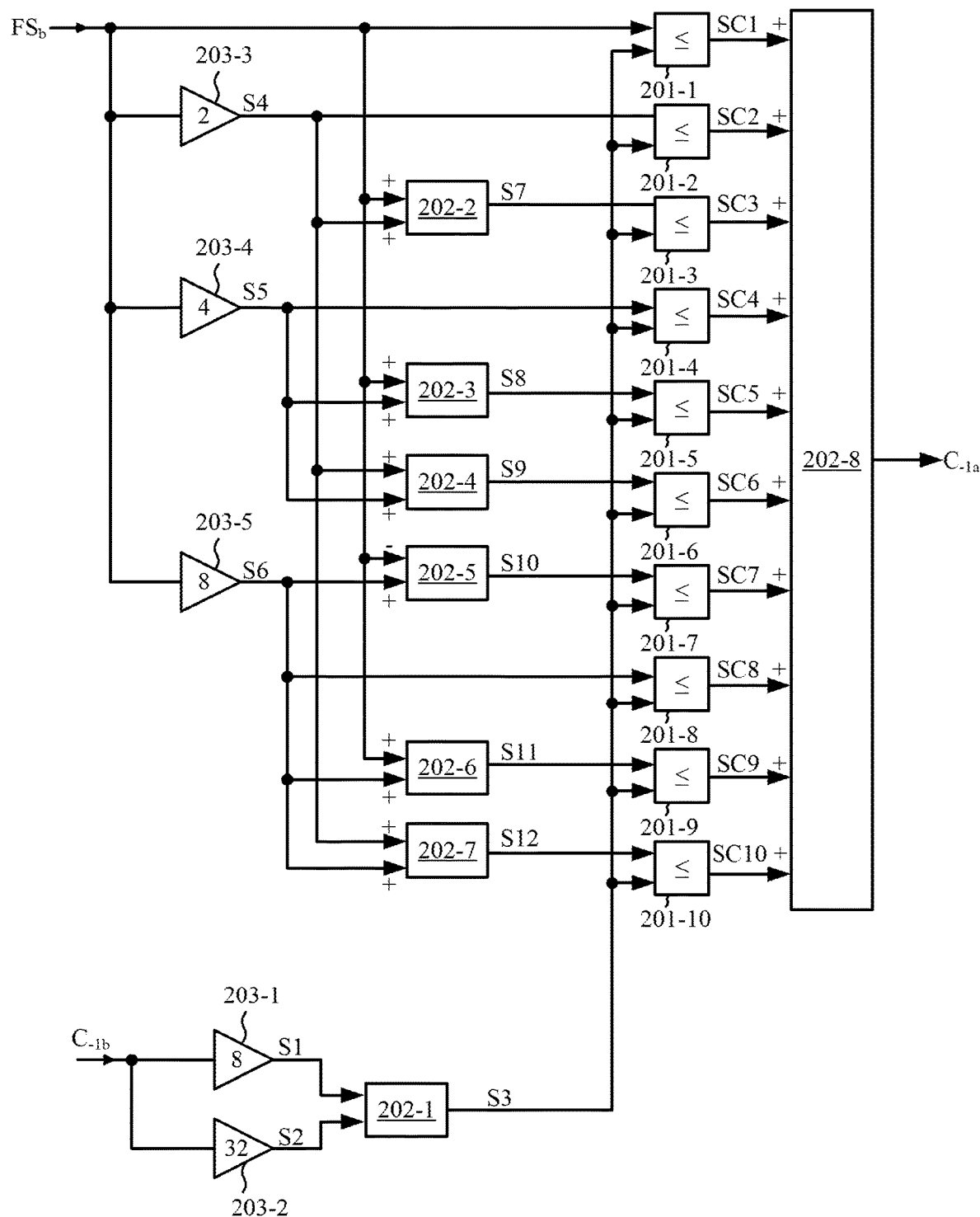
FIG. 2B is a schematic diagram of the processing circuit in FIG. 2A according to some embodiments of the present disclosure.

Reference is now made to FIG. 2B. FIG. 2B is a schematic diagram of the processing circuit 141 (or the processing circuit 142) in FIG. 2A according to some embodiments of the present disclosure. For ease of understanding, like elements in FIG. 2B are designated with the same reference numbers with respect to FIG. 2A.

As shown in FIG. 2B, the processing circuit 141 comprises N comparators 201-1 to 201-N (in the example, N is set as 10), a plurality of adders 202-1 to 202-8, and a plurality of multipliers 203-1 to 203-5. In some embodiments, N is a positive integer greater than or equal to 1. A value of N is related to the requirement of the predetermined communication protocol. In the example of FIG. 2B where the predetermined communication protocol is PCI-E, N may be set as 10. The above values of the predetermined coefficient $FS_a$ and N are given for illustrative purposes, and the present disclosure is not limited thereto.

The multipliers 203-1 and 203-2 are respectively configured to multiply the tap coefficient $C_{-1b}$ by predetermined values, in which a sum of the predetermined values described above is equal to the value of the predetermined coefficient $FS_a$. In the example of using PCI-E, the value of the predetermined coefficient $FS_a$ or $FS_b$ may be 32 or 40, but the present disclosure is not limited thereto. If the value of the predetermined coefficient $FS_a$ is 40, the multiplier 203-1 multiplies the tap coefficient $C_{-1b}$ by a predetermined value of 8 to generate a signal S1 (i.e., $8 \times C_{-1b}$). The multiplier 203-2 multiplies the tap coefficient $C_{-1b}$ by a predetermined value of 32 to generate a signal S2 (i.e., $32 \times C_{-1b}$). The adder 202-1 adds the signal S1 and the signal S2 to generate an operation signal S3 (i.e., $40 \times C_{-1b}$). Equivalently, the operation signal S3 is equal to the result of the multiplication operation (i.e., $C_{-1b} \times FS_a$) in equation (4). If the value of the predetermined coefficient $FS_a$ is 32 rather than 40, the multiplier 203-1 can be turned off to output the operation signal S3 having a value of $32 \times C_{-1b}$.

In some other embodiments, the multipliers 203-1 and 203-2 and the added 202-1 may be replaced with a single multiplier with an adjustable multiple (not shown in the figure), in order to directly provide the multiple same as the value of the predetermined coefficient $FS_a$, in order to adjust the tap coefficient $C_{-1b}$ to generate the operation signal S3. The implementations of performing the equation (4) are given for illustrative purposes, but the present disclosure is not limited thereto. Various circuit configurations able to perform the equation (4) are within the contemplated scope of the present disclosure.

In some embodiments, as shown in FIG. 2B, the N comparators 201-1 to 201-10, the adders 202-2 to 202-8, and the multipliers 203-1 to 203-5 are configured to perform subtraction operations to equivalently perform the division operation in equation (4) (i.e., $1/FS_b$). The related operations and detailed circuit configuration here will be explained in the following paragraphs.

In greater detail, the multipliers 203-3 to 203-5 respectively multiply the predetermined coefficient $FS_b$ by predetermined values 2, 4, and 8, in order to generate operation signals S4 (i.e., $2 \times FS_b$), S5 (i.e., $4 \times FS_b$), and S6 (i.e., $8 \times FS_b$). In some embodiments, each of the multipliers 203-1 to 203-5 may be implemented by an operational circuit or an amplifier.

Alternatively, in some embodiments, each of the multipliers 203-1 to 203-5 may be implemented by a shifter circuit, and a multipliers (i.e., the predetermined values) of the multipliers 203-1 to 203-5 are all multiples of 2 (for example, the above mentioned 2, 4, 8, 32, etc.). In the embodiment where the shifter circuits are employed, the multiplication operation of each of the multipliers 203-1 to 203-5 can be equivalently performed by performing one or more bit shift operations. Taking the operation signal S4 as an example, the multiplier 203-1 can shift the predetermined coefficient $FS_b$ by 1 bit to the left in order to generate the operation signal S4 (i.e., $2 \times FS_b$). In other words, the multiplier 203-3 can provide a multiplicand having a value of 2 and a multiplication operation by shifting 1 bit to the left. Similarly, the multiplier 203-4 can shift the predetermined coefficient $FS_b$ by 2 bits to the left to output the operation signal S5 (i.e., $4 \times FS_b$). In this manner, the original multiplication operations are performed by simple bit shift operations to further reduce the circuit complexity and cost of the processing circuit 141.

The adder 202-2 adds the predetermined coefficient $FS_b$ and the operation signal S4 to generate an operation signal S7 (i.e., $3 \times FS_b$). The adder 202-3 adds the predetermined coefficient $FS_b$ and the operation signal S5 to generate an operation signal S8 (i.e., $5 \times FS_b$). The adder 202-4 adds the signal S2 and the operation signal S5 to generate an operation signal S9 (i.e., $6 \times FS_b$). The adder 202-5 subtracts the predetermined coefficient $FS_b$ from the operation signal S6 to generate an operation signal S10 (i.e., $7 \times FS_b$). The adder 202-6 adds the predetermined coefficient $FS_b$ and the operation signal S6 to generate an operation signal S11 (i.e., $9 \times FS_b$). The adder 202-7 adds the operation signal S4 and the operation signal S6 to generate an operation signal S12 (i.e., $10 \times FS_b$).

The comparators 201-1 to 201-10 respectively compare the operation signal S3 with the predetermined coefficient $FS_b$ and the plurality of operations signals S4, S7, S5, S8, S9, S10, S6, S11, and S12 to output a plurality of comparison signals SC1 to SC10. Taking the first comparator 201-1 as an example, when the predetermined coefficient FSb is smaller than or equal to the signal S3, the comparator 201-1 outputs the comparison signal SC1 having a logic value of "1." Otherwise, the comparison signal SC1 having a logic value of "0" is output. With this analogy, the operations of the other comparators 201-2 to 201-10 can be deduced, the repetitious descriptions are not given herein. The adder 202-8 is configured to add the comparison signals SC1 to SC10, in order to generate the tap coefficient $C_{-1a}$. Accordingly, the operation regarding the tap coefficient $C_{-1a}$ (i.e., equation (4)) is completed.

For example, it is assumed that the operation signal S3 is six times the predetermined coefficient $FS_b$. Under this condition, the plurality of comparison signals SC1 to SC6 will be logic "1", and the plurality of comparison signals SC7 to SC10 are logic "0". In this manner, the adder 202-8 can output the tap coefficient $C_{-1a}$ having a value of 6. As compared with performing the division operation directly, in this example, the processing circuit 141 performs the division operation in the equation (4) equivalently by performing multiple subtraction operations and comparison operations. Hence, the circuit complexity and cost of the processing circuit 141 can be effectively reduced by replacing the original division operation with simpler operation methods (i.e., the subtraction operations and comparison operations).

As mentioned previously, the processing circuit 141 and the processing circuit 142 may have the same circuit configuration. For example, as shown in FIG. 2B, when the multipliers 203-1 and 203-2 receive the tap coefficient $C_{1b}$, the adder 202-8 can generate the tap coefficient $C_{1a}$. After the tap coefficients $C_{-1a}$ and $C_{1a}$ are determined, the processing circuit 143 in FIG. 2A can perform the operation of the above equation (5) to determine the tap coefficient $C_{0a}$. Accordingly, by using the circuit configurations of FIG. 2A and FIG. 2B, the control circuitry 140 can calculate at least one system parameter (such as the tap coefficient $C_{ia}$) of the transceiver circuitry 120 based on the device data D1B (including information such as the tap coefficient $C_{ib}$, the predetermined coefficient $FS_b$, etc.) of the device to be linked (i.e., the external device 100B), the device data D1 (including information such as the predetermined coefficient $FS_a$, etc.) of the signal transmission device 100 itself, and the predetermined communication protocol when establishing the link, in order to ensure that the signal transmission device 100 can exchange data with the external device 100B correctly through the channel 100A.

In some embodiments, the transceiver circuitry 120B of the external device 100B also can perform the above operations to adjust parameters of its internal circuitry so that the external device 100B can be ensured to exchange data with the signal transmission device 100 correctly through the channel 100A.

The predetermined communication protocol being PCI-E in the above embodiments is given for illustrative purposes. In different applications, the type and number of system parameters may be changed depending on the type of the predetermined communication protocol. Therefore, the present disclosure is not limited to the above embodiments.

Figure 3:
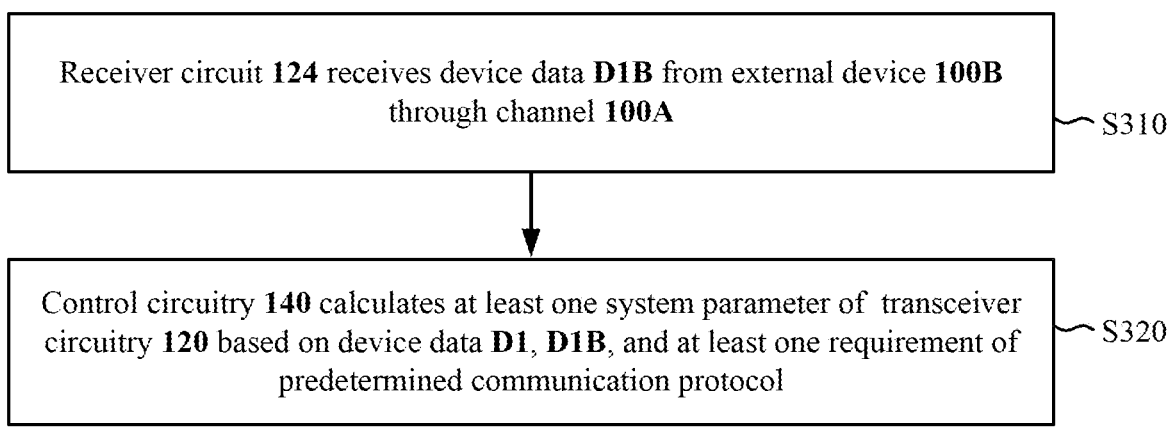
FIG. 3 is a flowchart of a linking method according to some embodiments of the present disclosure.

FIG. 3 is a flowchart of a linking method 300 according to some embodiments of the present disclosure. For ease of understanding, the linking method 300 is described with reference to the above figures.

In operation S310, the receiver circuit 124 receives the device data D1B from the external device 100B through the channel 100A.

For example, as shown in the above FIG. 1A, the signal transmission device 100 can receive the device data D1B from the external device 100B when establishing the link. The device data D1B includes information, such as at least one system parameter (for example, including the tap coefficient $C_{ib}$ and the predetermined coefficient $FS_b$) of the internal circuit (e.g., the transceiver circuitry 120B) in the external device 100B, etc.

In operation 320, the control circuitry 140 calculates at least one system parameter of the transceiver circuitry 120 based on device data D1, D1B, and at least one requirement of the predetermined communication protocol.

For example, as shown in the above FIG. 1B to FIG. 2B, in the example where the predetermined communication protocol is the PCI-E, the control circuitry 140 can perform the related operations of the above equations (4) and (5) based on the device data D1 (including information such as the predetermined coefficient $FS_a$, etc.) and the device data D1B (for example, including the tap coefficient $C_{ib}$ and the predetermined coefficient $FS_b$) by the processing circuits 141 to 143, in order to determine the system parameter (i.e., the tap coefficient $C_{ia}$) of the internal circuit 150.

With operation S320, simple operations (which may include, for example, shift operation, add/subtract operation, etc.) can be performed based on the device data of the device to be linked without setting lookup tables, in order to adjust parameters of related circuit settings in the transceiver circuitry. As a result, the required circuitry cost can be significantly reduced while the control circuitry 140 may be able to be applied to link settings in various types of link partners.

The multiple operations of the above linking method 300 are given for illustrative purposes, and the present disclosure is not limited to being performed in the order of this example. Various operations of the linking method 300 may be appropriately added, replaced, omitted, or performed in different orders, without departing from the sprit and scope of the various embodiments of the present disclosure.

As described above, the signal transmission device and the linking method thereof according to embodiments of the present disclosure can perform simple operations based on the device data of the device to be linked and the requirement of the communication protocol to adjust the setting of its internal circuit, in order to ensure that the signal of the device to be linked can be correctly received. As a result, the cost of memory for disposing multiple lookup tables can be saved while the control circuitry is applicable to the related settings of various manufacturers.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A signal transmission device comprising:
   a transceiver circuitry configured to receive first device data from an external device through a channel, wherein the transceiver circuitry comprises a finite impulse response filter; and
   a control circuitry configured to calculate a plurality of tap coefficients associated with the finite impulse response filter based on the first device data, a predetermined coefficient of second device data associated with the transceiver circuitry, and at least one requirement of a predetermined communication protocol, in order to link with the external device,
   wherein according to the at least one requirement of the predetermined communication protocol, a sum of absolute values of the plurality of tap coefficients is set to be equal to the predetermined coefficient.

2. The signal transmission device of claim 1, wherein the control circuitry is configured to perform a plurality of shift operations, a plurality of add operations, and a plurality of comparison operations based on the first device data and the second device data, in order to calculate the at least one system parameter.

3. The signal transmission device of claim 1, wherein the control circuitry comprises:
   a first processing circuit configured to calculate a first tap coefficient of the plurality of tap coefficients based on a first coefficient and an another predetermined coefficient in the first device data;
   a second processing circuit configured to calculate a second tap coefficient of the plurality of tap coefficients based on a second coefficient and the another predetermined coefficient in the first device data; and
   a third processing circuit configured to subtract an absolute value of the first tap coefficient and an absolute value of the second tap coefficient from the predetermined coefficient in the second device data to calculate a third tap coefficient of the tap coefficients.

4. The signal transmission device of claim 3, wherein the first processing circuit comprises:
   a plurality of first multipliers configured to respectively multiply the another predetermined coefficient by a plurality of first predetermined values to generate a plurality of first operation signals;
   a plurality of first adders configured to generate a plurality of second operation signals based on the another predetermined coefficient and the first operation signals;
   a plurality of comparators configured to respectively compare a third operation signal with the second operation signals to generate a plurality of comparison signals; and
   a second adder configured to add the plurality of comparison signals to generate the first tap coefficient.

5. The signal transmission device of claim 4, wherein the first processing circuit further comprises:
   a second multiplier configured to multiply the first coefficient by a second predetermined value to generate a first signal;
   a third multiplier configured to multiply the first coefficient by a third predetermined value to generate a second signal, wherein a sum of the second predetermined value and the third predetermined value is equal to the predetermined coefficient; and
   a third adder configured to add the first signal and the second signal to generate the third operation signal.

6. The signal transmission device of claim 5, wherein each of the plurality of first predetermined values, the second predetermined value, and the third predetermined value is a multiple of 2.

7. The signal transmission device of claim 6, wherein each of the first multipliers, the second multiplier, and the third multiplier is configured to perform a shift operation.

8. The signal transmission device of claim 3, wherein the first processing circuit and the second processing circuit have a same circuit configuration.

9. The signal transmission device of claim 1, wherein the predetermined communication protocol is a peripheral component interconnect express (PCI-E) protocol.

10. A linking method comprising:
receiving first device data from an external device through a channel; and
calculating a plurality of tap coefficients associated with a finite impulse response filter of a transceiver circuitry based on the first device data, a predetermined coefficient of second device data associated with the transceiver circuitry, and at least one requirement of a predetermined communication protocol, in order to link with the external device;
wherein according to the at least one requirement of the predetermined communication protocol, a sum of absolute values of the plurality of tap coefficients is set to be equal to the predetermined coefficient.

11. The linking method of claim 10, wherein calculating the at least one system parameter comprises:
performing a plurality of shift operations, a plurality of add operations, and a plurality of comparison operations based on the first device data and the second device data to calculate the at least one system parameter.

12. The linking method of claim 10, wherein calculating the at least one system parameter comprises:
calculating a first tap coefficient of the tap coefficients based on a first coefficient and an another predetermined coefficient in the first device data;
calculating a second tap coefficient of the tap coefficients based on a second coefficient and the another predetermined coefficient in the first device data; and
subtracting an absolute value of the first tap coefficient and an absolute value of the second tap coefficient from the predetermined coefficient in the second device data to calculate a third tap coefficient of the tap coefficients.

13. The linking method of claim 12, wherein calculating the first tap coefficient comprises:
respectively multiplying the another predetermined coefficient by a plurality of first predetermined values to generate a plurality of first operation signals;
generating a plurality of second operation signals based on the another predetermined coefficient and the first operation signals;
respectively comparing a third operation signal with the second operation signals to generate a plurality of comparison signals; and
adding the plurality of comparison signals to generate the first tap coefficient.

14. The linking method of claim 13, further comprising:
multiplying the first coefficient by a second predetermined value to generate a first signal;
multiplying the first coefficient by a third predetermined value to generate a second signal, wherein a sum of the second predetermined value and the third predetermined value is equal to the predetermined coefficient; and
adding the first signal and the second signal to generate the third operation signal.

15. The linking method of claim 14, wherein each of the plurality of first predetermined values, the second predetermined value, and the third predetermined value is a multiple of 2.

16. The linking method of claim 15, wherein each of the first operation signals, the first signal, and the second signal is generated through a shift operation.

17. The linking method of claim 12, wherein calculating the at least one system parameter comprises:
calculating the at least one system parameter without disposing a lookup table.

18. The linking method of claim 10, wherein the predetermined communication protocol is a peripheral component interconnect express (PCI-E) protocol.

* * * * *